United States Patent
Embleton et al.

(10) Patent No.: US 11,122,718 B2
(45) Date of Patent: Sep. 14, 2021

(54) SYSTEM AND METHOD FOR DEVICE LEVEL ELECTROMAGNETIC INTERFERENCE MANAGEMENT

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/516,433

(22) Filed: Jul. 19, 2019

(65) Prior Publication Data

US 2021/0022276 A1    Jan. 21, 2021

(51) Int. Cl.
| | |
|---|---|
| *G06F 1/16* | (2006.01) |
| *H05K 5/00* | (2006.01) |
| *H05K 7/00* | (2006.01) |
| *H05K 9/00* | (2006.01) |
| *H05K 7/20* | (2006.01) |
| *H05K 7/14* | (2006.01) |

(52) U.S. Cl.
CPC ......... *H05K 9/0062* (2013.01); *H05K 7/1492* (2013.01); *H05K 7/20* (2013.01)

(58) Field of Classification Search
CPC .. H05K 9/0009; H05K 9/0018; G06F 1/1656; H04B 15/02
See application file for complete search history.

(56) References Cited

U.S. PATENT DOCUMENTS

| | | | |
|---|---|---|---|
| 4,785,136 A | 11/1988 | Mollet et al. | |
| 4,858,309 A | 8/1989 | Korsunsky et al. | |
| 4,871,220 A | 10/1989 | Kohin | |
| 5,049,701 A | 9/1991 | Vowles et al. | |
| 5,084,802 A * | 1/1992 | Nguyenngoc | H05K 9/0062 174/368 |
| 5,250,752 A | 10/1993 | Cutright | |
| 5,294,748 A | 3/1994 | Schwenk et al. | |
| 5,323,298 A | 6/1994 | Shatas et al. | |
| 5,437,560 A | 8/1995 | Mizuguchi | |
| 5,545,844 A | 8/1996 | Plummer, III et al. | |
| 5,649,831 A | 7/1997 | Townsend | |
| 5,762,513 A | 6/1998 | Stine | |

(Continued)

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

(Continued)

*Primary Examiner* — Anthony M Haughton
(74) *Attorney, Agent, or Firm* — Chamberlain, Hrdlicka, White, Williams & Aughtry

(57) ABSTRACT

A data processing device includes an internal volume that is electromagnetic interference (EMI) isolated for housing EMI emitting devices, the internal volume is isolated by at least 80 decibels. The data processing device further includes a thermal management system adapted to control a flow of gas through the internal volume. The data processing device further includes a chassis, adapted to mount to a frame. The chassis includes the internal volume and the thermal management system. The thermal management system is disposed outside of the internal volume.

20 Claims, 11 Drawing Sheets

(56) References Cited

U.S. PATENT DOCUMENTS

| | | |
|---|---|---|
| 5,812,370 A | 9/1998 | Moore et al. |
| 5,943,218 A | 8/1999 | Liu |
| 6,011,221 A | 1/2000 | Lecinski et al. |
| 6,038,130 A | 3/2000 | Boeck et al. |
| 6,045,385 A | 4/2000 | Kane |
| 6,068,009 A | 5/2000 | Paes et al. |
| 6,176,727 B1 | 1/2001 | Liu et al. |
| 6,208,514 B1 | 3/2001 | Stark et al. |
| 6,225,554 B1 | 5/2001 | Trehan et al. |
| 6,242,690 B1 | 6/2001 | Glover |
| 6,269,001 B1 | 7/2001 | Matteson et al. |
| 6,331,940 B1 | 12/2001 | Lin |
| 6,332,792 B1 | 12/2001 | Lin et al. |
| 6,370,036 B1 | 4/2002 | Boe |
| 6,377,451 B1 | 4/2002 | Furuya |
| 6,437,987 B1 | 8/2002 | Lin |
| 6,517,369 B1 | 2/2003 | Butterbaugh et al. |
| 6,613,977 B1 | 9/2003 | Fowler |
| 6,657,214 B1 | 12/2003 | Foegelle et al. |
| 6,695,630 B1 | 2/2004 | Ku |
| 6,870,092 B2 | 3/2005 | Lambert et al. |
| 6,947,290 B2 | 9/2005 | Hirata |
| 7,035,087 B2 | 4/2006 | Tan |
| 7,075,796 B1 | 7/2006 | Pritchett |
| 7,133,296 B2 | 11/2006 | Choi et al. |
| 7,287,996 B1 | 10/2007 | Shing |
| 7,371,097 B1 | 5/2008 | Pennypacker et al. |
| 7,371,977 B1 | 5/2008 | Preonas |
| 7,692,934 B2 | 4/2010 | Bartscher et al. |
| 7,695,313 B2 | 4/2010 | Karim et al. |
| 7,757,847 B2 | 7/2010 | Tang et al. |
| 8,059,414 B2 | 11/2011 | Wei |
| 8,098,492 B2 | 1/2012 | Rosenberg et al. |
| 8,243,469 B2 | 8/2012 | Jaze et al. |
| 8,310,834 B2 | 11/2012 | Fürholzer |
| 8,508,956 B2 | 8/2013 | Nicol |
| 8,530,756 B1 | 9/2013 | Winch |
| 8,636,526 B2 | 1/2014 | Funamura et al. |
| 8,642,900 B2 | 2/2014 | Nordling et al. |
| 8,662,295 B2 | 3/2014 | Kubota et al. |
| 8,687,374 B2 | 4/2014 | Watanabe et al. |
| 8,720,682 B2 | 5/2014 | Navon et al. |
| 8,760,859 B2 | 6/2014 | Fuchs et al. |
| 8,969,738 B2 | 3/2015 | Ross |
| 9,019,711 B2 | 4/2015 | Tamura |
| 9,095,045 B2 | 7/2015 | Rojo |
| 9,370,132 B2 | 6/2016 | Coppola |
| 9,497,894 B1 | 11/2016 | Ramsey |
| 9,549,480 B1* | 1/2017 | Besterman ........... H05K 5/0204 |
| 9,585,270 B2 | 2/2017 | Yang et al. |
| 9,603,280 B2 | 3/2017 | Frank et al. |
| 9,607,660 B2 | 3/2017 | Bennett, II et al. |
| 9,640,910 B1 | 5/2017 | Chien et al. |
| 9,642,290 B2 | 5/2017 | Anderson et al. |
| 9,820,404 B1 | 11/2017 | Wu et al. |
| 9,829,939 B1 | 11/2017 | Lien et al. |
| 9,930,816 B2 | 3/2018 | Winch et al. |
| 10,007,309 B1 | 6/2018 | Imwalle |
| 10,249,984 B1 | 4/2019 | Rask |
| 10,364,031 B2 | 7/2019 | Goupil |
| 10,420,258 B1 | 9/2019 | Rahilly et al. |
| 10,477,740 B2 | 11/2019 | Coppola |
| 10,477,741 B1 | 11/2019 | Bae et al. |
| 10,492,324 B2 | 11/2019 | Miura |
| 10,520,532 B2 | 12/2019 | Lee |
| 10,541,519 B1 | 1/2020 | Wavering |
| 10,542,642 B2 | 1/2020 | Babhadiashar et al. |
| 10,575,443 B2 | 2/2020 | Woodbury, II et al. |
| 10,638,634 B1 | 4/2020 | Elsasser |
| 10,707,636 B2 | 7/2020 | Yamamoto |
| 10,720,722 B2 | 7/2020 | Tsorng et al. |
| 10,734,763 B2 | 8/2020 | M R et al. |
| 2002/0000645 A1 | 1/2002 | Sato et al. |
| 2002/0001181 A1 | 1/2002 | Kondo |
| 2002/0027769 A1 | 3/2002 | Kasahara et al. |
| 2002/0064035 A1 | 5/2002 | Mair et al. |
| 2003/0011988 A1 | 1/2003 | Irmer |
| 2003/0057131 A1 | 3/2003 | Diaferia |
| 2003/0137811 A1 | 7/2003 | Ling et al. |
| 2003/0174474 A1 | 9/2003 | Mair |
| 2003/0174487 A1 | 9/2003 | Garmong |
| 2005/0247471 A1 | 11/2005 | Archambeault |
| 2006/0025010 A1 | 2/2006 | Spitaels et al. |
| 2007/0105445 A1 | 5/2007 | Manto et al. |
| 2007/0145699 A1 | 6/2007 | Robbins |
| 2007/0147013 A1 | 6/2007 | Robbins |
| 2007/0151779 A1 | 7/2007 | Robbins |
| 2008/0076291 A1 | 3/2008 | Ewing et al. |
| 2009/0021925 A1* | 1/2009 | Heimann ............. H05K 9/0062 361/818 |
| 2009/0095523 A1* | 4/2009 | Stevenson ............ H05K 9/0062 174/565 |
| 2009/0146862 A1 | 6/2009 | Malone |
| 2010/0117579 A1 | 5/2010 | Culbert |
| 2010/0208433 A1* | 8/2010 | Heimann ................ H04Q 1/03 361/724 |
| 2010/0270299 A1 | 10/2010 | Baltussen |
| 2010/0285636 A1 | 11/2010 | Chen |
| 2010/0319981 A1 | 12/2010 | Kapusta et al. |
| 2011/0011760 A1 | 1/2011 | Habersetzer |
| 2011/0198245 A1 | 8/2011 | Soufan |
| 2011/0222249 A1 | 9/2011 | Ruehl et al. |
| 2011/0232956 A1 | 9/2011 | Ramsey |
| 2012/0011700 A1 | 1/2012 | Kelaher et al. |
| 2012/0044653 A1 | 2/2012 | Morris et al. |
| 2012/0073873 A1 | 3/2012 | Nash |
| 2012/0116590 A1 | 5/2012 | Florez-Iarrahondo |
| 2012/0178364 A1 | 7/2012 | Dobyns |
| 2012/0285738 A1 | 11/2012 | Cochrane et al. |
| 2013/0160563 A1 | 6/2013 | Dingler et al. |
| 2013/0194772 A1* | 8/2013 | Rojo ..................... H04Q 1/116 361/818 |
| 2013/0206470 A1 | 8/2013 | Davis |
| 2013/0258582 A1 | 10/2013 | Shelnutt et al. |
| 2013/0277520 A1 | 10/2013 | Funk et al. |
| 2014/0008119 A1 | 1/2014 | Brandt |
| 2014/0138388 A1 | 5/2014 | Synnestvedt |
| 2014/0368821 A1 | 12/2014 | Gazaway et al. |
| 2015/0014912 A1 | 1/2015 | Ivey et al. |
| 2015/0245529 A1 | 8/2015 | Tam et al. |
| 2015/0257310 A1 | 9/2015 | Desouza |
| 2015/0271959 A1 | 9/2015 | Chen et al. |
| 2015/0368423 A1 | 12/2015 | Yamauchi et al. |
| 2015/0373869 A1 | 12/2015 | Macerini et al. |
| 2016/0081231 A1 | 3/2016 | Berke |
| 2016/0111814 A1 | 4/2016 | Hirano et al. |
| 2016/0159480 A1 | 6/2016 | Barth |
| 2016/0182130 A1 | 6/2016 | Ahmed et al. |
| 2016/0372948 A1 | 12/2016 | Kvols |
| 2016/0381818 A1 | 12/2016 | Mills |
| 2017/0347496 A1 | 11/2017 | Smith |
| 2018/0062287 A1 | 3/2018 | Shaw et al. |
| 2018/0257334 A1 | 9/2018 | Motoyanagi et al. |
| 2019/0008079 A1 | 1/2019 | Kondo et al. |
| 2019/0050030 A1* | 2/2019 | Baum .................... G06F 1/189 |
| 2019/0056439 A1 | 2/2019 | Lee |
| 2019/0159371 A1 | 5/2019 | Grinsteinner |
| 2019/0230828 A1* | 7/2019 | Murch ................. H01R 25/162 |
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0379183 A1* | 12/2019 | Winsor ................. H05K 9/009 |
| 2020/0187394 A1* | 6/2020 | Murugesan ............. G06F 30/23 |
| 2020/0187578 A1 | 6/2020 | Sadato |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

(56) References Cited

OTHER PUBLICATIONS

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

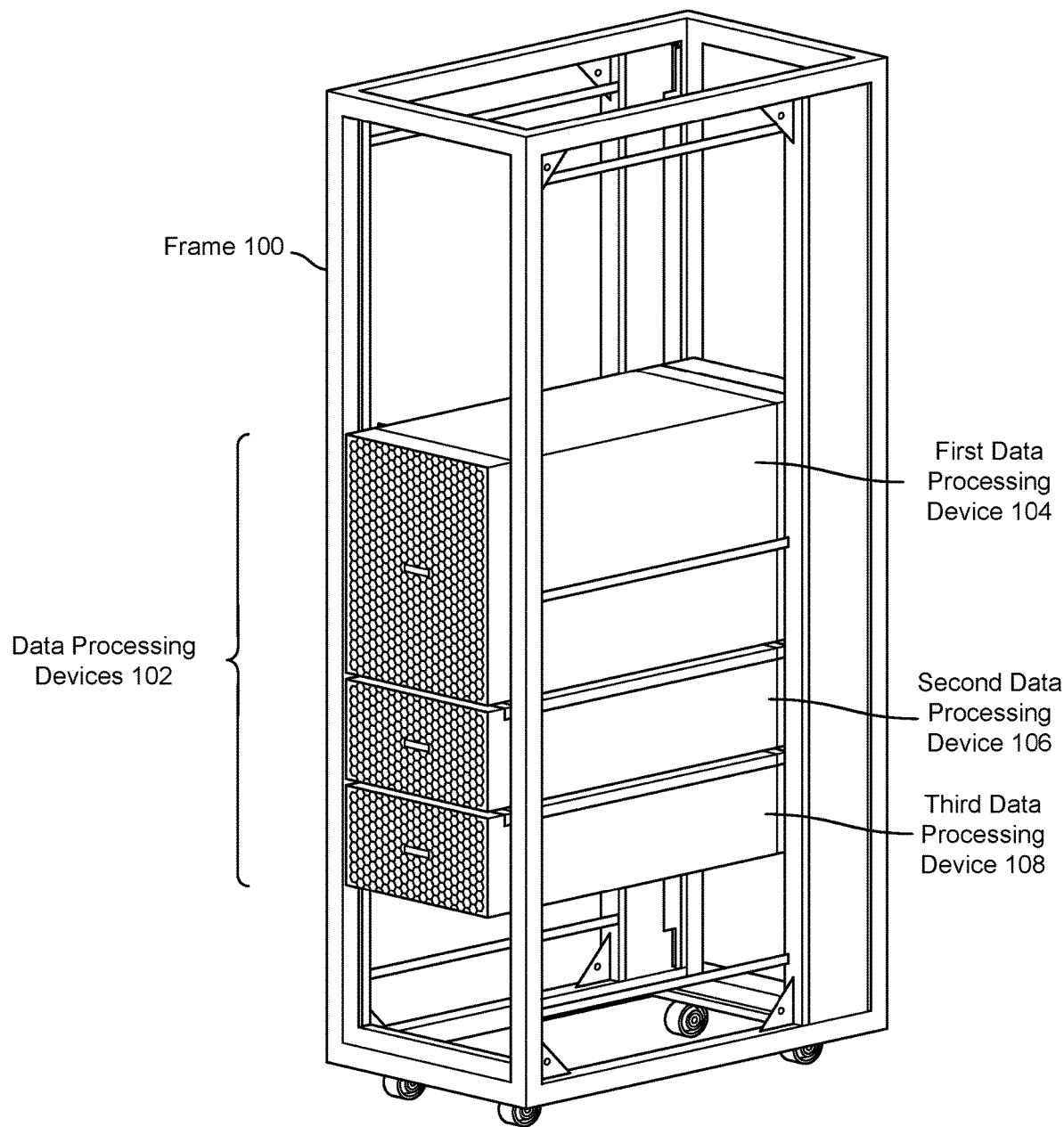
FIG. 1.1

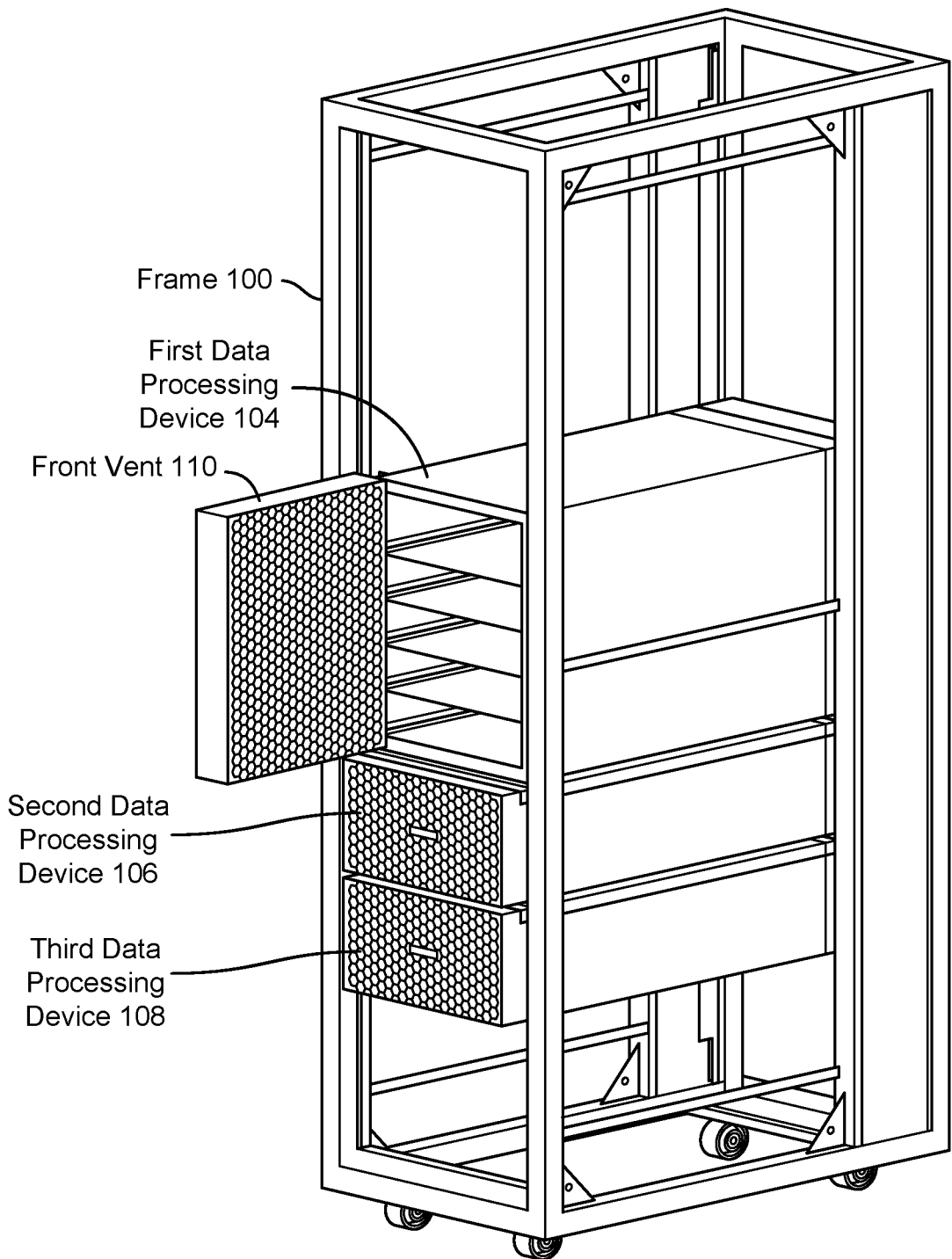
FIG. 1.2

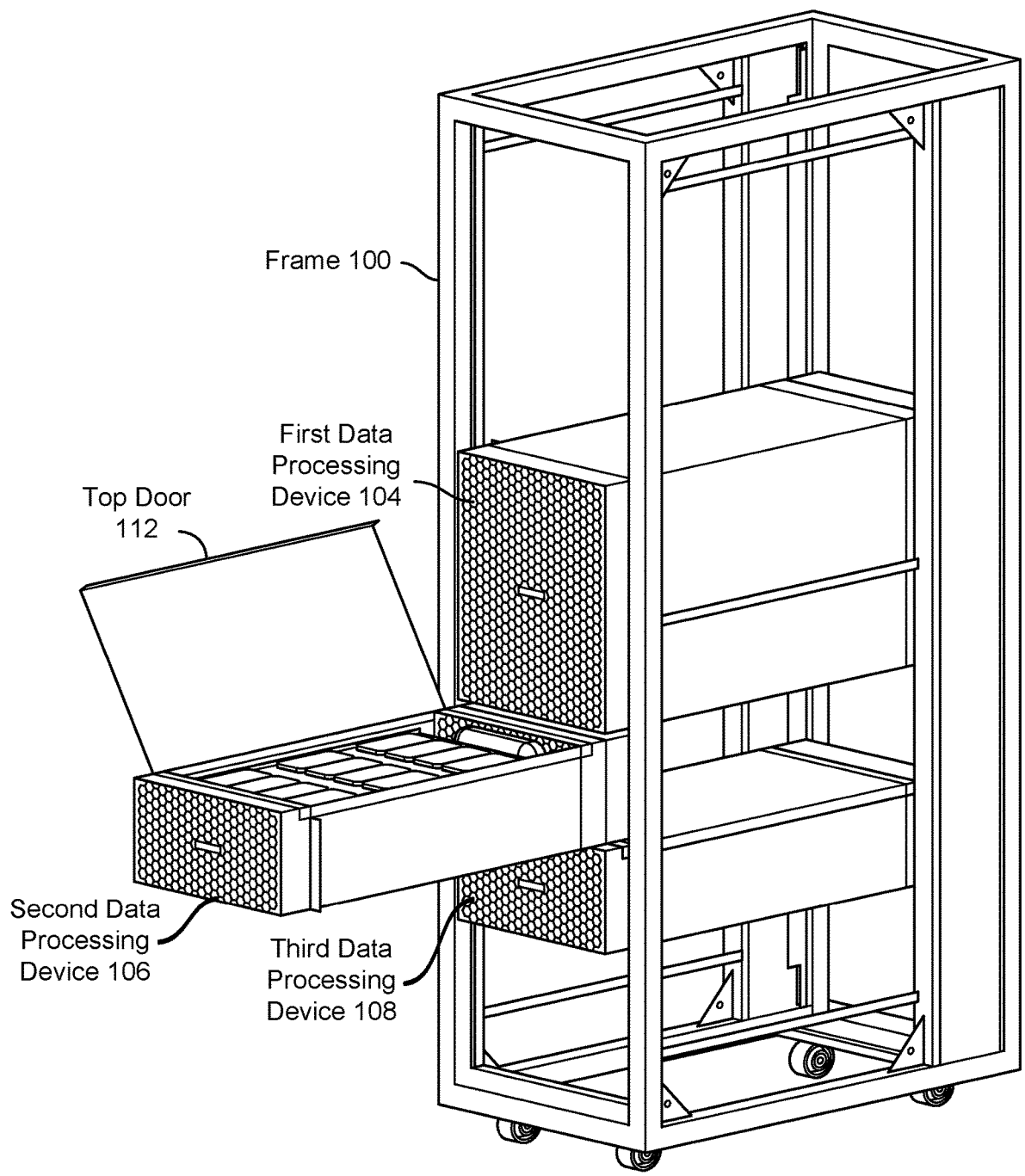
FIG. 1.3

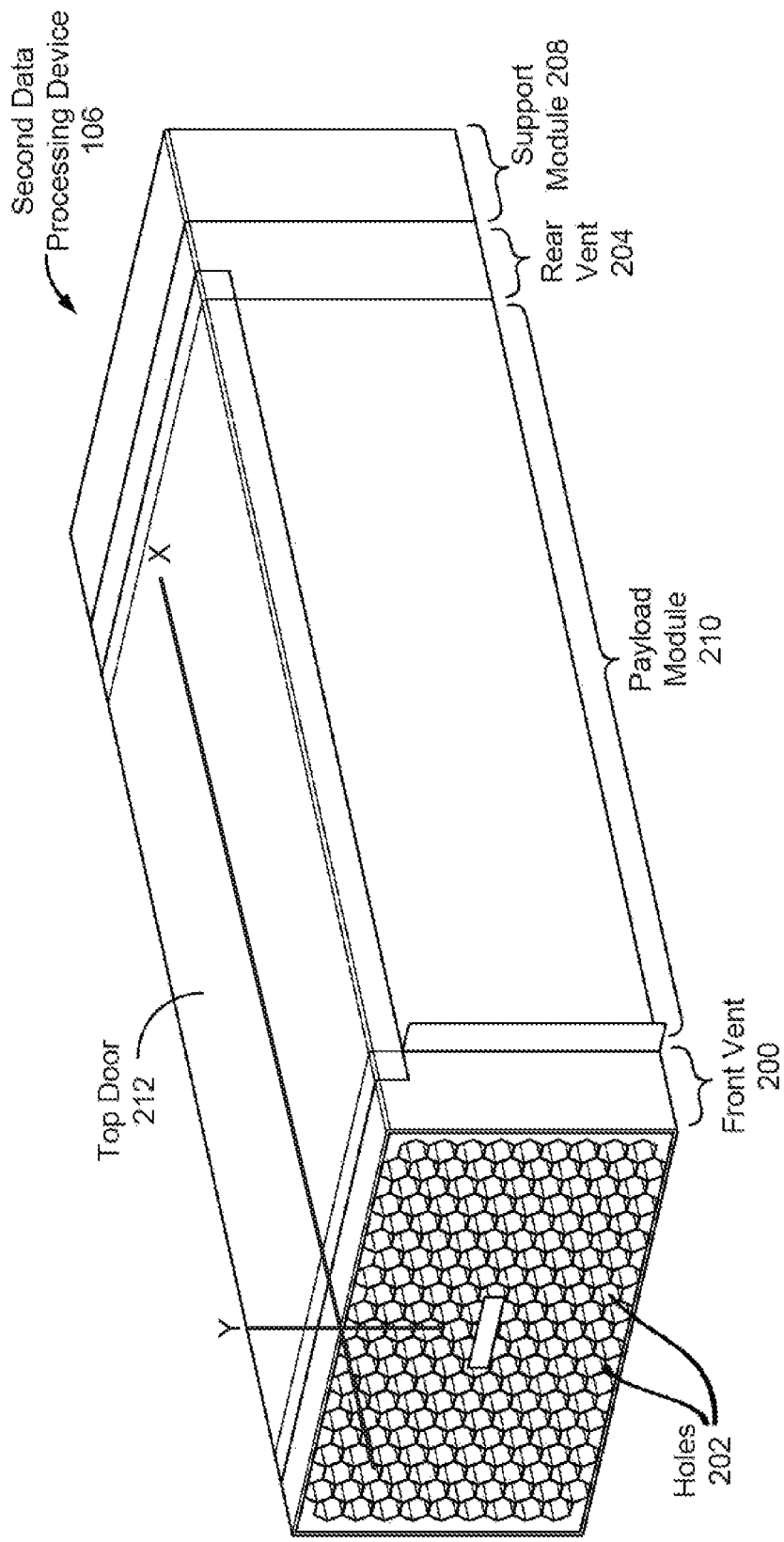
FIG. 2.1

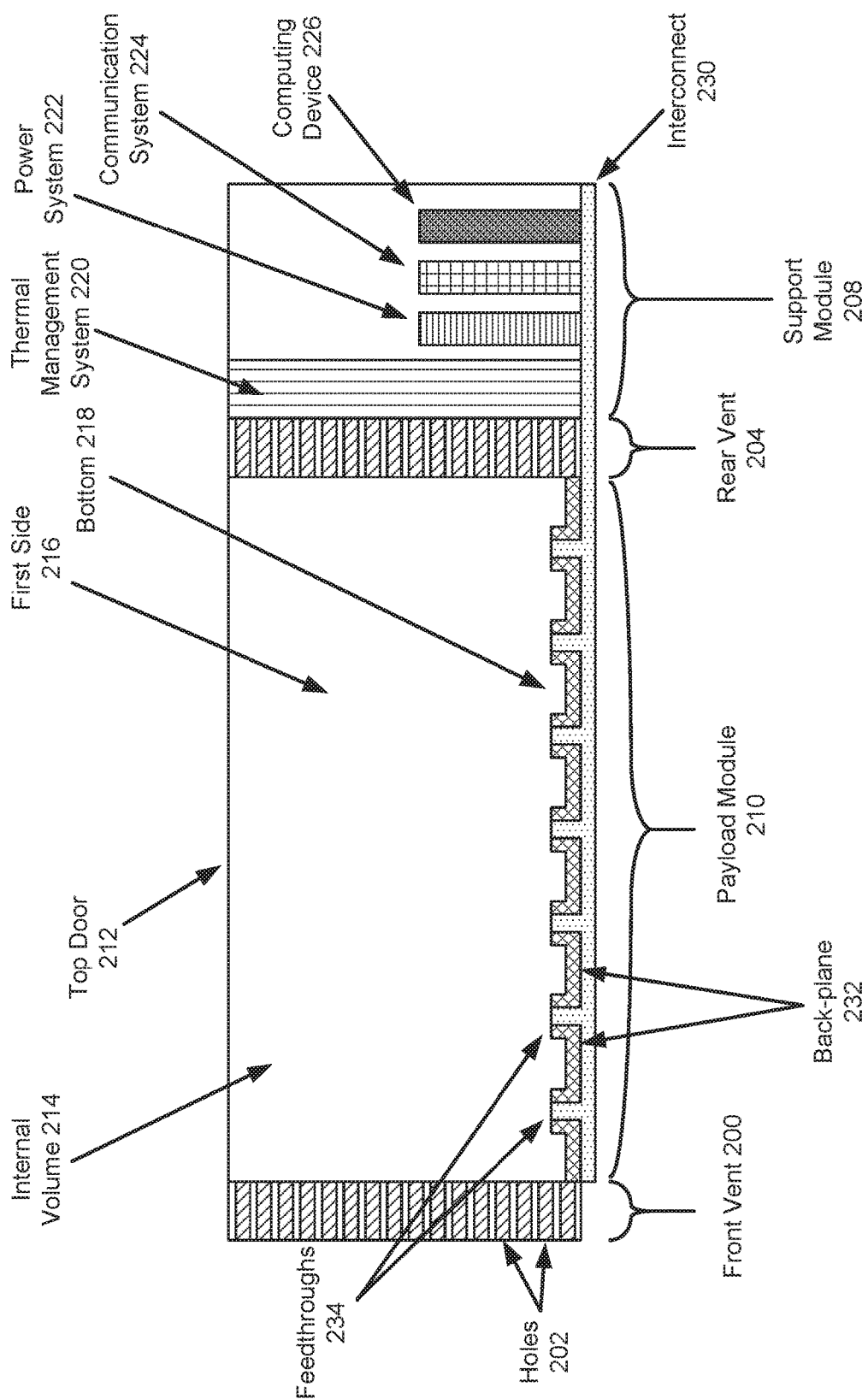
FIG. 2.2

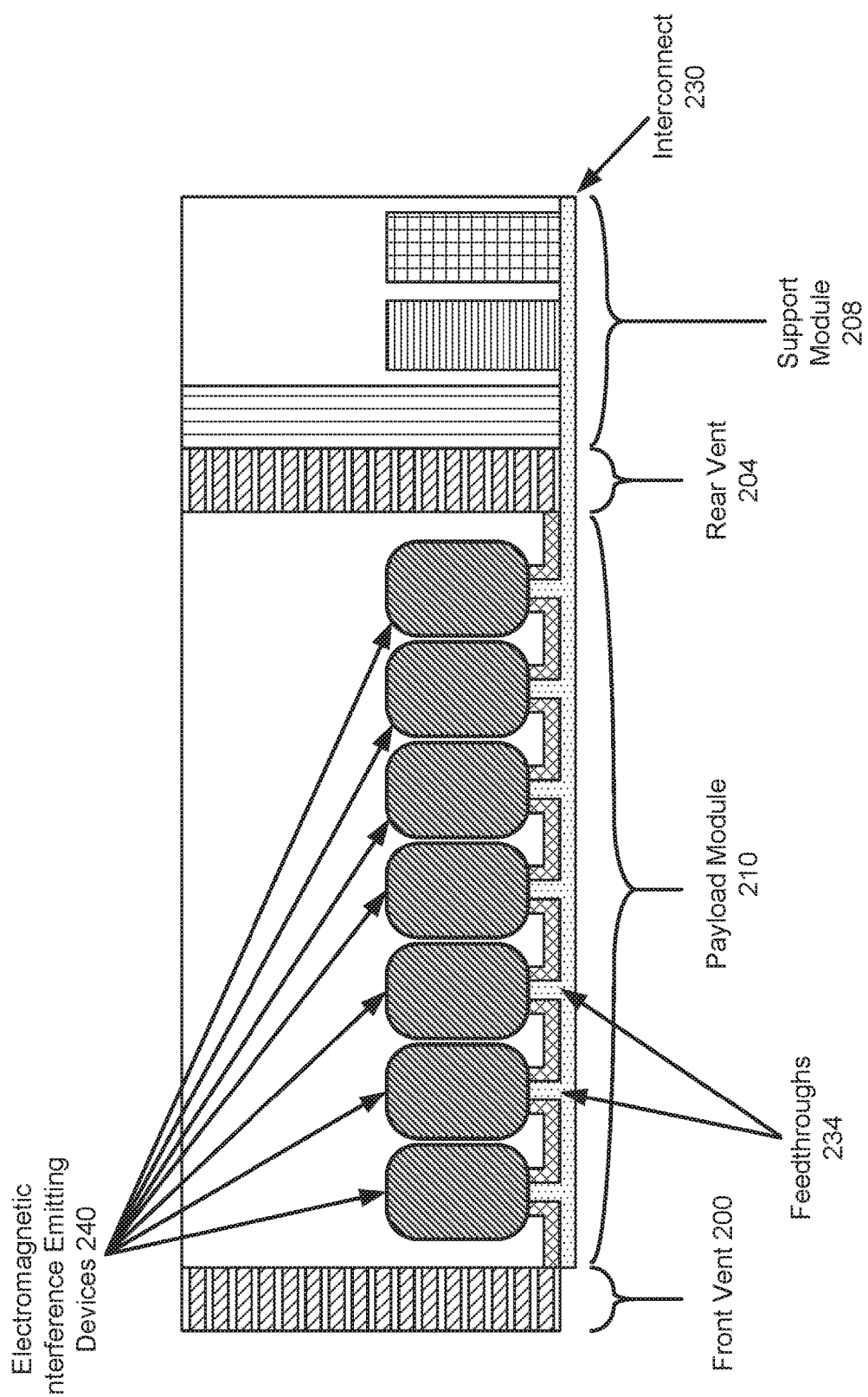
FIG. 2.3

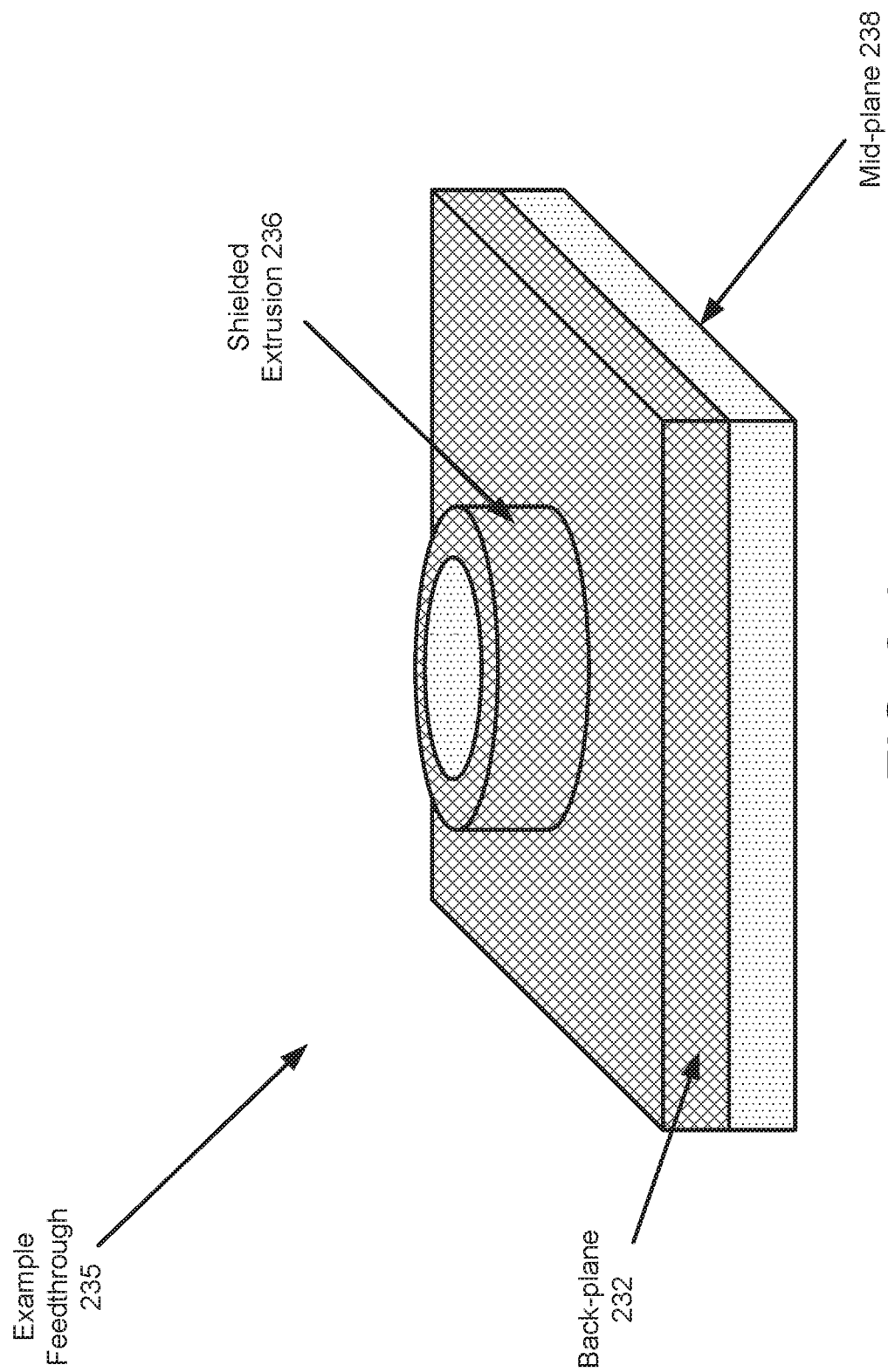
FIG. 2.4

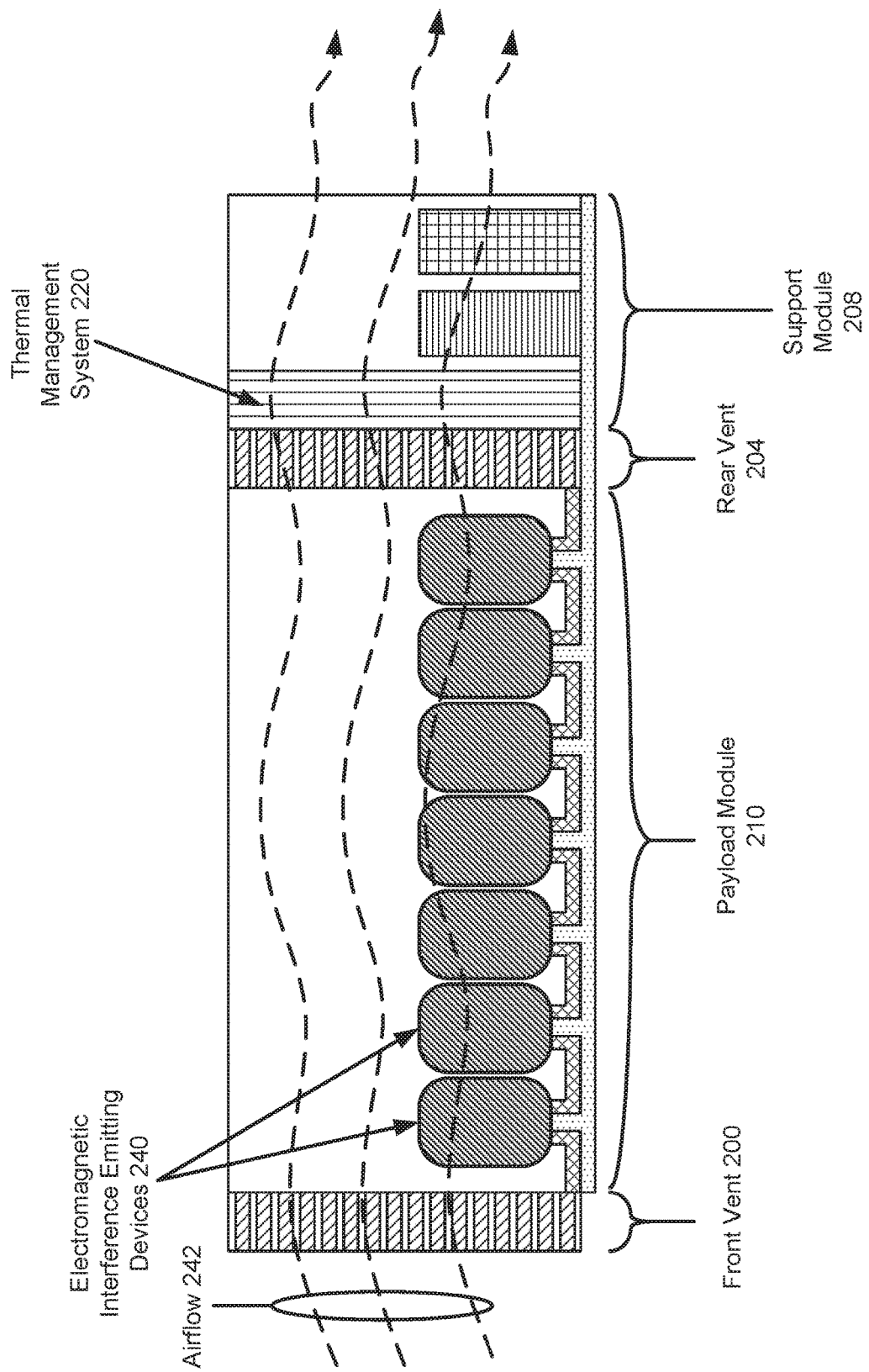
FIG. 2.5

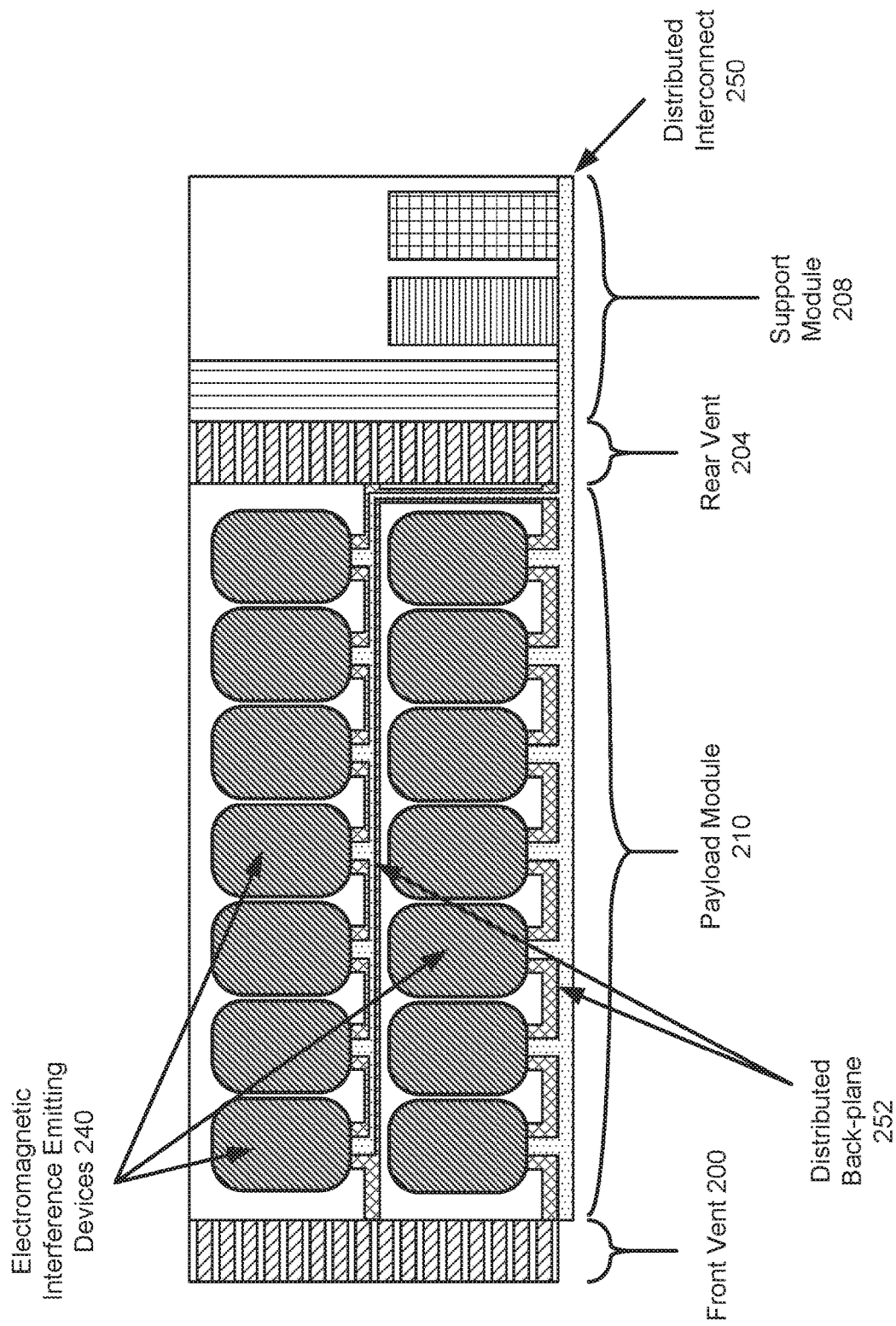
FIG. 2.6

SYSTEM AND METHOD FOR DEVICE LEVEL ELECTROMAGNETIC INTERFERENCE MANAGEMENT

BACKGROUND

High density environment may include devices that are tightly packed together. In other words, the devices may be physically close to each other. Such an environment present numerous challenges relating to thermal management, mechanical positioning and orienting of devices, and electrical concerns related to power and operation of such devices.

SUMMARY

In one aspect, a data processing device in accordance with one or more embodiments of the invention includes an internal volume that is electromagnetic interference (EMI) isolated for housing EMI emitting devices, the internal volume is isolated by at least 80 decibels; a thermal management system adapted to control a flow of gas through the internal volume; and a chassis adapted to mount to a frame. The chassis includes the internal volume and the thermal management system. The thermal management system is disposed outside the internal volume.

In one aspect, a system for providing electromagnetic interference (EMI) suppression for data processing devices in accordance with one or more embodiments of the invention includes a frame adapted to receive a first data processing device of the data processing devices and a second data processing device of the data processing devices; the data processing device including: a first internal volume for housing a first set of EMI emitting devices that is EMI isolated by at least 80 decibels, and a first support module; and a second data processing device of the data processing device, the second data processing device including a second internal volume for housing a second set of EMI emitting devices that is EMI isolated, and a second support module.

In one aspect, a method for managing electromagnetic interference (EMI), in accordance with one or more embodiments of the invention includes disposing an EMI emitting device that emits the EMI in an internal volume, that is EMI isolated by at least 80 decibels, of a data processing device; while the EMI emitting device is disposed in the internal volume: providing power to the EMI emitting device via a support module, of the data processing device, that is not EMI isolated; providing communication services to the EMI emitting device via the support module; and providing thermal management services to the EMI emitting device via the support module.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a data processing device in accordance with one or more embodiments of the invention.

FIG. 2.2 shows a first cross section diagram of the data processing device of FIG. 2.1.

FIG. 2.3 shows a second cross section diagram of the data processing device of FIG. 2.1.

FIG. 2.4 shows a diagram of a feedthrough in accordance with one or more embodiments of the invention.

FIG. 2.5 shows a third cross section diagram of the data processing device of FIG. 2.1.

FIG. 2.6 shows a fourth cross section diagram of the data processing device of FIG. 2.1.

DETAILED DESCRIPTION

Figure 3:
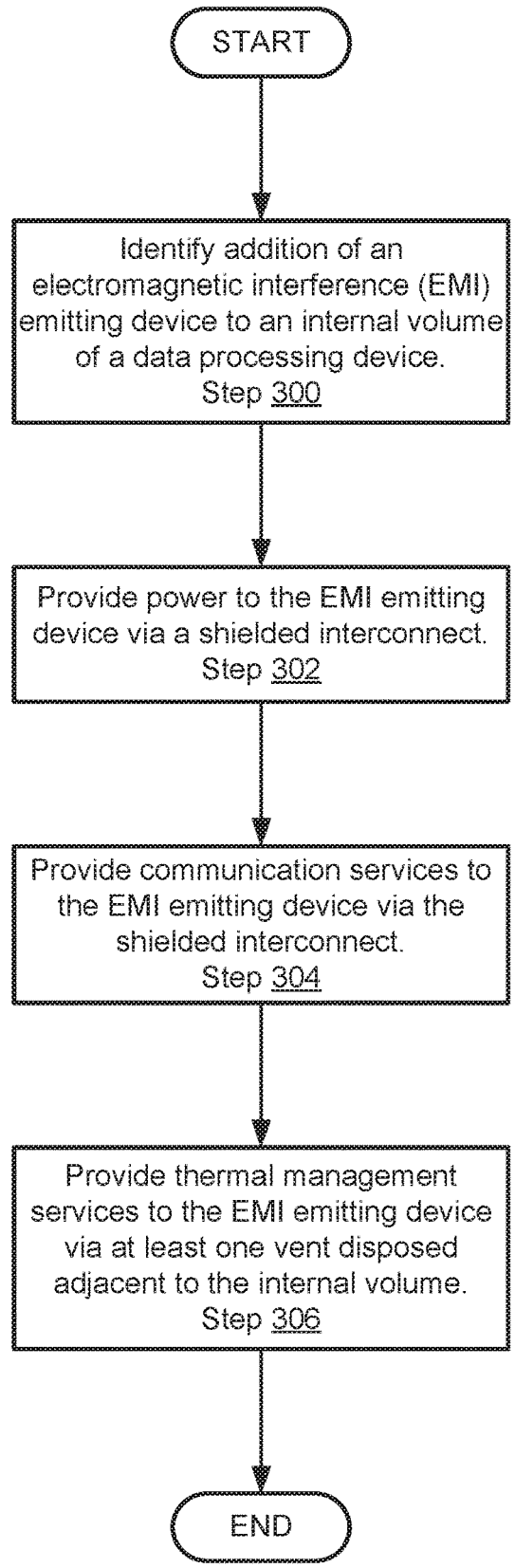
FIG. 3 shows a flowchart of a method of providing electromagnetic interference management services in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing device may isolate the electromagnetic interference emitting devices from the ambient environment proximate to the data processing device by at least 90 decibels (or another desirable level of electromagnetic interference suppression). For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The data processing devices may also facilitate the insertion, removal, and/or modification of electromagnetic interference emitting devices while maintaining the electromagnetic isolation of the aforementioned devices from the ambient environment. By doing so, such electromagnetic interference emitting devices may be utilized, in a high-density setting, while mitigating the potential impact on the high-density environment of inclusion of such devices.

In one or more embodiments of the invention, at least one data processing device includes a support module for providing services to electromagnetic interference emitting devices disposed in the internal volume. The services may include communication services, power supply services, thermal management services, and/or other types of services. By doing so, placement of the electromagnetic interference emitting devices within the internal volume may not negatively impact the operation the electromagnetic interference emitting devices due to the electromagnetic isolation of the internal volume. In contrast to the internal volume, the support module may not be electromagnetically isolated from the ambient environment.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment around the data processing devices (102) and/or other locations by at least 90 decibels (or another suitable level). The electromagnetic interference isolation provided by the data processing devices (102) may have a frequency dependent response. For example, the data processing devices (102) may provide at least 90 decibels, or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more interior volumes. The interior volumes may facilitate disposing of the one or more computing devices (and/or other devices) within a data processing device.

To house the one or more electromagnetic interference emitting devices, the chassis may include one or more interior volumes. The interior volumes may have a shape or other characteristic(s) that facilitates disposing of the one or more electromagnetic interference emitting devices within the data processing device. For example, an interior volume of the chassis may be a rectangular void capable of housing one or more electromagnetic interference emitting devices.

In one or more embodiments of the invention, the one or more interior volumes of the data processing devices are adapted to restrict propagation of electromagnetic interference emitted by the electromagnetic interference emitting devices (and/or other devices such as computing devices). For example, one or more portions of the chassis that bound the one or more interior volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more interior regions may be formed in a manner that filters electromagnetic radiation when electromagnetic radiation passes through the portions of the chassis. For example, a portion of the chassis that bounds the one or more interior regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more interior regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels) when propagating from within the data processing devices (102)

into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices. The gas may be air or another type/combination of gasses obtained from any source. By doing so, the thermal state (i.e., temperature) of the aforementioned devices may be regulated.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.6.

As discussed above, data processing devices (102) may house electromagnetic interference emitting devices. When so housed, the electromagnetic interference emitting devices may operate thereby generating electromagnetic interference. At different points in time, it may be useful to add or remove electromagnetic interference emitting devices to or from the data processing devices (102). To facilitate such additions and/or removals, different portions of the data processing devices (102) may be adapted to reversibly provide access to the interior volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the interior volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (110) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.6 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200). For additional details regarding the internal volume and propagation of electromagnetic interference via the front vent (200), refer to FIGS. 2.2-2.6.

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference devices, (ii) limiting propagation of electromagnetic interference from internal volumes of the second data processing device (106) to the ambient environment surrounding the second data processing device (106), and (iii) thermally regulating devices disposed within the payload module (210). For additional details regarding the payload module (210), refer to FIGS. 2.2-2.6.

The support module (208) may be a physical device for housing devices that provide services to devices disposed within the payload module (210). For example, the support module (208) may house one or more power supplies, fans, networking devices, and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services means reduces the strength of electromagnetic radiation by at least 20 decibels when the electromagnetic radiation propagates from an internal volume of a data processing environment to an ambient environment outside of the data processing device. The reduction of the electromagnetic radiation may be by at least other levels (e.g., 30 decibels, 35, decibels, etc.) without departing from the invention.

The one or more power supplies may supply power to other devices. For example, the power supplies may provide power to electromagnetic interference emitting devices disposed within the payload module (210), other types of devices (e.g., computing device) disposed within the payload module, and/or devices located in other areas.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the electromagnetic interference emitting devices disposed within the payload module (210) to communicate with other devices (e.g., computing devices that may be controlling the operation of the electromagnetic interference emitting devices). Because such devices may be electromagnetically isolated from the ambient environment by virtue of being disposed in the payload module, such devices may not be able to wirelessly communicate with devices disposed outside of the second data processing device (106).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 4.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by atop door (212), a bottom (218), a first side (216), and a second side (not shown). These four components of the payload module (210) may define a rectangular shape of the internal volume (214).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow from between the two vents through the internal volume (214). For additional discussion of gas flow paths, refer to FIG. 2.5.

As discussed above, the second data processing device may control gas flows disposed within the second data processing device to provide thermal management services. To do so, the second data processing device may include a thermal management system. The thermal management system may include (i) flow control devices, (ii) temperature sensors, and/or (iii) a controller.

The controller may operate the flow control devices based on temperature information obtained from the temperature sensors and/or temperature information obtained from other devices (e.g., from electromagnetic interference emitting devices). For example, the controller may increase the flow rate of an gas flow disposed within the second data processing devices to manage the temperature of one or more devices within a predetermined range.

The flow control devices may be, for example, fans or other types of active devices for controlling the flow of gasses. The thermal management system (220) may include any number of flow control devices without departing from the invention.

The second data processing device may also include a power system (222). The power system may provide power to any number and/or types of devices disposed within the second data processing device. For example, the power system (222) may provide power to electromagnetic interference emitting devices disposed within the payload module (210), the thermal management system (220), a communication system (224), and/or computing devices (226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system may provide communication services to devices disposed outside of the second data processing device. As discussed above, due to the electromagnetic interference isolation provided by the second data processing device, components disposed within the payload module (610) may be unable to wirelessly communicate with devices outside of the second data processing device.

To do so, the communication system (224) may include, for example, one or more transceivers, communication processors, and/or other types of components for providing communication services. The aforementioned components may provide the communication services. The communication services may include, for example, exchanging network data units with electromagnetic interference emitting devices disposed in the payload module, a computing device (226) disposed in the support module (208), and/or other devices disposed outside of the second data processing device. By doing so, the aforementioned devices may communicate with one another via information included in the exchanged network data units. A network data unit may be a communication supported by a communication protocol that enables information to be transmitted. A network data unit may be, for example, a packet in the event that an internet protocol is utilized. As will be discussed in greater detail below, the communication system (224) may provide the communication services using an interconnect (230).

The computing device (226) may manage the operation of the components of the second data processing device. For example, the computing device (226) may manage the thermal management system (220), the power system (222), the communication system (224), and/or other components (such as electromagnetic interference emitting devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support any communication protocol to provide such operable connections.

For example, the interconnect (230) may include a set of wires that physical interconnect devices disposed within the second data processing device. The set of wires may be utilized by the devices to communicate with each other.

In one or more embodiments of the invention, the interconnect (230) facilitates communications between electromagnetic interference emitting devices disposed within the payload module (210) while the electromagnetic interference emitting devices are isolated. By doing so, the electromagnetic interference emitting devices may communicate with devices outside of the payload module (210) without negatively impacting the operation of other devices due to electromagnetic interference generated by the electromagnetic interference emitting devices.

To do so, the second data processing device may include a back-plane (232). The back-plane may electromagnetically isolate the interconnect (230) from the internal volume of the payload module (210). For example, the back-plane (232) may be a metal sheet of sufficient thickness to prevent electromagnetic interference from penetrating through the back-plane (232).

The back-plane (232) may include any number of feedthroughs (234). The feedthroughs (234) may be physical devices that enable the interconnect (230) to physically connect to any number of devices disposed within the payload module (210). For additional details regarding feedthroughs (234), refer to FIG. 2.4.

To further clarify the use of feedthroughs (234) in connection with devices disposed within the payload module (210), FIG. 2.3 shows a cross section diagram of the second data processing devices in accordance with one or more embodiments of the invention in a state in which electromagnetic interference emitting devices (240) have been disposed in the payload module (210).

As seen from FIG. 2.3, each of the electromagnetic interference emitting devices (240) may be disposed proximate to one of the feedthroughs (234). The feedthroughs may enable each of the electromagnetic interference emitting devices (240) to be physically connected to the interconnect. By doing so, the electromagnetic interference emitting devices (240) may utilize the interconnect to communicate with other devices (e.g., via the communication system). Consequently, the electromagnetic interference emitting devices (240) may be operably connected to devices, external to the payload module, while being electromagnetically isolated from the devices for radiative electromagnetic interference purposes.

As noted above, the feedthroughs (234) may enable electromagnetic interference emitting devices (240) to be operably connected to other devices while still being electromagnetically isolated. FIG. 2.4 shows a diagram of an example feedthrough (235) in accordance with one or more embodiments of the invention.

The example feedthrough (235) may include a shielded extrusion (236). The shielded extrusion (236) may be an extrusion that extends away from the back-plane (232). The extrusion may have a shape that is complementary to a portion of an electromagnetic interference emitting device. The portion of the electromagnetic interference emitting device may be a connector such as a USB connector (e.g., USB type C) or a Thunderbolt connector. The connector may be other types of connectors.

The shielded extrusion (236) may include a hollow portion that enables a portion of the interconnect, such as a mid-plane (238) of a circuit board or other interconnect type device, to physically contact a portion of the electromagnetic interference emitting device. For example, the shielded extrusion (236) may be a hollow tubular structure of a predetermined height.

The extrusion may ground the portion of the electromagnetic interference emitting device to the back-plane (232). Consequently, the shielded extrusion (236) may prevent electromagnetic interference within the payload module from propagating through the hollow portion of the shielded extrusion (236) and into the interconnect. Thus, the example feedthrough may facilitate the operable connection of an electromagnetic interference emitting device to other devices while the electromagnetic interference emitting device is disposed within the payload module.

The shielded extrusion (236) may also be adapted to position and/or orient an electromagnetic interference emitting device within the payload module. For example, the placement and/or orientation of the shielded extrusion (236) may position and orient the electromagnetic interference emitting device. For example, by having a shape that is complimentary to a portion of the electromagnetic interference emitting device, the shielded extrusion (236) may form an interference with the electromagnetic interference emitting device when the electromagnetic interference emitting device is physically disposed on the shielded extrusion (236). The interference may reversibly lock the electromagnetic interference emitting device into a predetermined position and/or orientation.

When the electromagnetic interference emitting devices are disposed within the payload module, the second data processing device may provide thermal management services to the electromagnetic interference emitting devices by controlling the flow of gasses proximate to the electromagnetic interference emitting devices. FIG. 2.5 shows a cross section diagram illustrating gas flow (242) that may be generated by the second data processing device in accordance with one or more embodiments of the invention.

As seen from FIG. 2.5, the generated gas flow (242) may traverse through the internal volume (214) of the payload module (210) and through the support module (208). The gas flow (242) may exchange heat with the electromagnetic interference emitting devices and other devices. Consequently, the thermal state of each of the devices disposed within the second data processing device may be regulated using the gas flow (242).

The gas flow may be generated and/or controlled by the thermal management system (220). For example, the thermal management system (220) may cause fans, or other flow control devices, to control the rate of the gas flow (242). Consequently, the rate of thermal exchange may be modulated to more rapidly or slowly remove heat from the devices disposed within the second data processing device.

While the second data processing device has been illustrated above as being capable of having a single row of electromagnetic interference emitting devices being disposed in the payload module (210), embodiments of the invention are not so limited. For example, the interconnected and back-plane may have different shapes to facilitate the disposition of any number of electromagnetic interference emitting devices within the payload module (210) without departing from the invention.

FIG. 2.6 shows a diagram of an embodiment of the invention in which the second data processing device includes a distributed interconnect (250). As seen from FIG. 2.6, the distributed interconnect may have a more complicated shape, than that illustrated in FIGS. 2.2-2.5, which enables multiple rows of electromagnetic interference emitting devices (240) to be disposed within the payload module (210). A distributed back-plane (252) may complement the distributed interconnect (250) to electromagnetically isolate it from the internal volume (214) in which electromagnetic interference generated by the electromagnetic interference emitting devices (240) may exist. Consequently, the electromagnetic interference emitting devices (240) may still be isolated from the ambient environment even in the configuration illustrated in FIG. 2.6.

While illustrated as being disposed at specific locations and in specific orientations, the shape of the distributed interconnect (250) and the distributed back-plane (252) may be adapted as necessary to enable electromagnetic interference emitting devices to be disposed in different positions and/or orientations within the payload module (210) without departing from the invention. Further, while the electromagnetic interference emitting devices (240) have been illustrated as having similar shapes, the electromagnetic interference emitting devices (240) may be of different shapes and/or sizes without departing from the invention.

To further clarify aspects of embodiments of the invention, a method that may be performed in conjunction and/or separately from the system of FIG. 1.1 is illustrated in FIG. 3. The aforementioned method may be performed when providing electromagnetic interference management services.

FIG. 3 shows a flowchart of a method in accordance with one or more embodiments of the invention. The method depicted in FIG. 3 may be used to manage electromagnetic interference in accordance with one or more embodiments of the invention. The method shown in FIG. 3 may be performed completely, or in part, by, for example, data processing devices (e.g, 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, an addition of an electromagnetic interference emitting device to an internal volume of a data processing device is identified.

In one or more embodiments of the invention, the electromagnetic interference emitting device is identified using an interconnect. For example, when the electromagnetic interference emitting device is disposed in the internal volume, the electromagnetic interference emitting device may be physically connected to the interconnect. The electromagnetic interference emitting device may communicate with other devices via the interconnect while being electromagnetically isolated from other devices while disposed in the internal volume. The addition may be identified via messages sent from the electromagnetic interference emitting device via the interconnect.

In Step 302, power is provided to the electromagnetic interference emitting device via a shielded interconnect.

In one or more embodiments of the invention, the power is provided by transmitting the power to the electromagnetic interference emitting device through the interconnect. The interconnect may traverse through a feedthrough to the electromagnetic interference emitting device. The feedthrough may shield the interconnect from electromagnetic interference present in the internal volume.

In Step 304, communication services are provided to the electromagnetic interference emitting device via the shielded interconnect. As discussed above, the interconnect may provide an operable connection. The communication services may be provided by communicating with the electromagnetic interference emitting device using the interconnect.

In Step 306, thermal management services are provided to the electromagnetic interference emitting device via at least one vent disposed adjacent to the internal volume.

In one or more embodiments of the invention, the thermal management services are provided by monitoring the temperature of the electromagnetic interference emitting device using information reported by the electromagnetic interference emitting device. For example, the electromagnetic interference emitting device may send messages via the interconnect that indicate a temperature of the electromagnetic interference emitting device. Based on the temperature of the electromagnetic interference emitting device, a rate of gas flow through the vent may be controlled. For example, the speed of a fan or another type of flow control device may be modulated based on the temperature of the electromagnetic interference emitting device. Consequently, the thermal state of the electromagnetic interference emitting device may be managed by modifying the rate of the gas flow through the vent. The vent may be, for example, a rear vent of the data processing device.

The method may end following Step 306.

Thus, via the method illustrated in FIG. 3, electromagnetic interference emitting devices disposed within a data processing device may be managed to enable, for example, testing of the electromagnetic interference emitting device in a high density environment without negatively impacting the environment.

Figure 4:
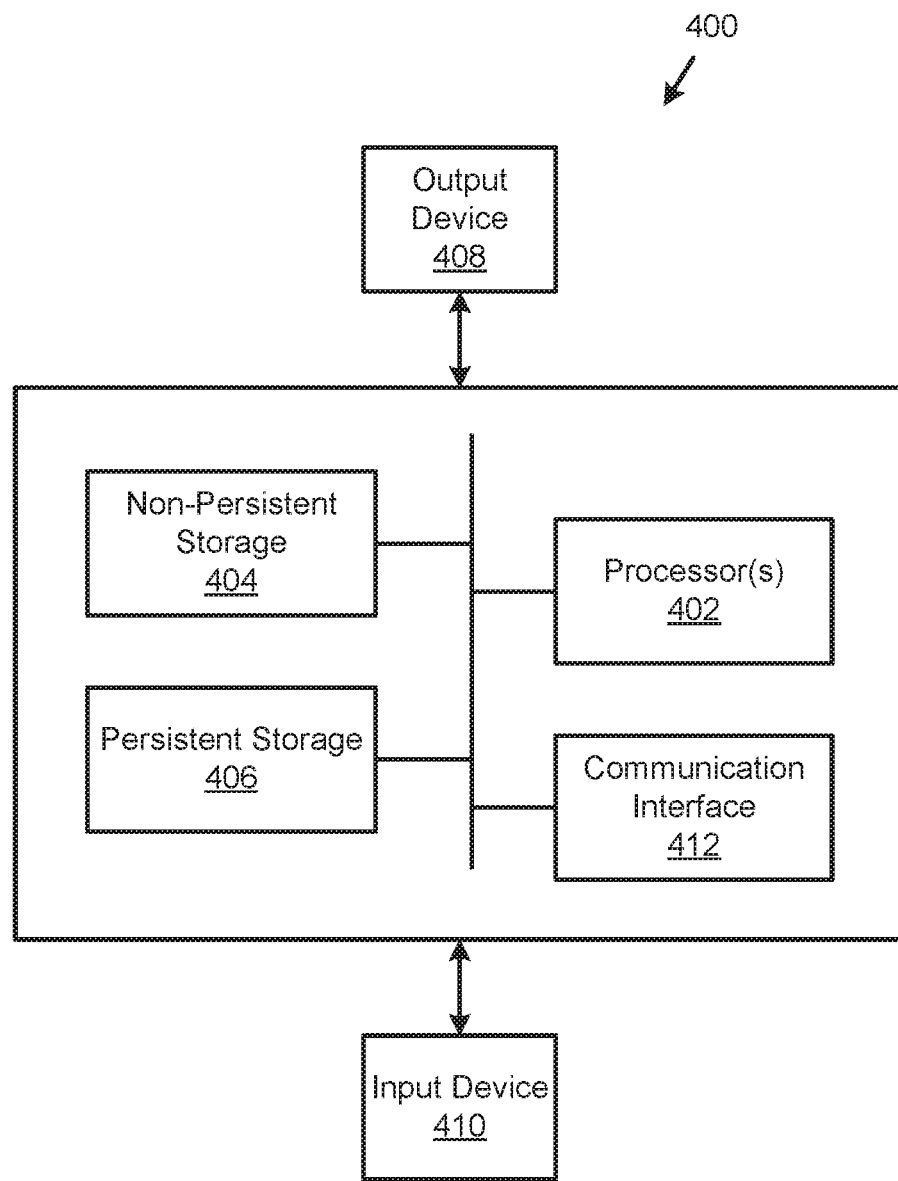
FIG. 4 shows a diagram of a computing device in accordance with one or more embodiments of the invention.

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of the invention may include a payload module and a support module. The payload module may be electromagnetically isolated from an ambient environment while the support module may not be electromagnetically isolated from an ambient environment. The support module may include components that provide services to components disposed within the payload module. By doing so, the operation of the components disposed within the payload module may not be deleteriously impacted by being electromagnetically isolated from the ambient environment.

Thus, embodiments of the invention may address the problem electromagnetic interference within a high-density environment. Specifically, embodiments of the invention may provide a data processing device level solution that facilitates granular control of electromagnetic interference in the aforementioned environments.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
   an internal volume that is electromagnetic interference (EMI) isolated for housing EMI emitting devices, wherein the internal volume is isolated by at least 80 decibels;
   a thermal management system adapted to control a flow of gas through the internal volume; and
   a chassis, adapted to mount to a frame, comprising the internal volume and the thermal management system, wherein the thermal management system is disposed outside of the internal volume.

2. The data processing device of claim 1, further comprising
   a communications system adapted to provide communications services to the EMI emitting devices,
   wherein the communications system is disposed outside the internal volume.

3. The data processing device of claim 2, wherein the communication system comprises:
   a mid-plane interconnecting a portion of the EMI emitting devices and a transceiver of the communication system.

4. The data processing device of claim 2, wherein the communication system further comprises:
   a back-plane that defines a portion of a side of the internal volume.

5. The data processing device of claim 4, wherein the back-plane comprises feedthroughs corresponding to physical connections between the EMI emitting devices and the communications system.

6. The data processing device of claim 5, wherein the feedthroughs comprise shielded extrusions having a shape corresponding to a shape of an interconnect of the EMI emitting devices.

7. The data processing device of claim 1, further comprising:
   a power system adapted to power a portion of the EMI emitting devices.

8. The data processing device of claim 7, wherein the power system is disposed outside of the internal volume.

9. The data processing device of claim 1, wherein the thermal management system comprises:
   a vent that defines a portion of a side of the internal volume; and
   a flow control device that controls a flowrate of the flow of gas.

10. The data processing device of claim 9, wherein the thermal management system controls the flowrate based on thermal state information obtained from the electromagnetic interference emitting devices.

11. A system for providing electromagnetic interference (EMI) suppression for data processing devices, comprising:
a frame adapted to receive a first data processing device of the data processing devices and a second data processing device of the data processing devices;
the data processing device comprising:
a first internal volume for housing a first set of EMI emitting devices that is EMI isolated by at least 80 decibels, and
a first support module; and
a second data processing device of the data processing device, the second data processing device comprising:
a second internal volume for housing a second set of EMI emitting devices that is EMI isolated, and
a second support module.

12. The system of claim 11, wherein the first support module is not EMI isolated from the second support module.

13. The system of claim 11, wherein the first support module is EMI isolated from the second set of EMI emitting devices via the second internal volume.

14. The system of claim 11, wherein the first support module is EMI isolated from the first set of EMI emitting devices via the first internal volume.

15. The system of claim 11, wherein the second support module is EMI isolated from the first set of EMI emitting devices via the first internal volume.

16. The system of claim 11, wherein the second support module is EMI isolated from the second set of EMI emitting devices via the second internal volume.

17. A method for managing electromagnetic interference (EMI), comprising:
disposing an EMI emitting device that emits the EMI in an internal volume, that is EMI isolated by at least 80 decibels, of a data processing device;
while the EMI emitting device is disposed in the internal volume:
providing power to the EMI emitting device via a support module, of the data processing device, that is not EMI isolated;
providing communication services to the EMI emitting device via the support module; and
providing thermal management services to the EMI emitting device via the support module.

18. The method of claim 17, wherein providing the thermal management services to the EMI emitting device comprises:
generating a gas flow through the internal volume using a flow control device disposed outside of the internal volume.

19. The method of claim 18, wherein the gas flow through the internal volume is generated by generating a first gas flow outside of the internal volume and directing the generated first gas flow through a first vent that defines a first side of the internal volume and through a second vent that defines a second side of the internal volume.

20. The method of claim 17, wherein providing the communication services to the EMI emitting device comprises:
sending network data units through an interconnect to the EMI emitting device,
wherein the interconnected is attached to the EMI emitting device via a feedthrough that traverses a backplane that defines a side of the internal volume.

* * * * *